(12) United States Patent
Vowe

(10) Patent No.: US 6,314,150 B1
(45) Date of Patent: Nov. 6, 2001

(54) LOCK DETECTOR CIRCUIT FOR A PHASE-LOCKED LOOP

(75) Inventor: Achim Vowe, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/079,586

(22) Filed: May 15, 1998

(30) Foreign Application Priority Data

May 15, 1997 (DE) .............................................. 197 20 446

(51) Int. Cl.[7] ...................................................... H03D 3/24
(52) U.S. Cl. .................... 375/374; 375/376; 331/DIG. 2; 327/150; 327/151; 327/159
(58) Field of Search .................................... 375/375, 376, 375/373, 374; 331/1 A, DIG. 2; 327/147, 150, 151, 156, 159, 163

(56) References Cited

U.S. PATENT DOCUMENTS

| 5,008,635 | * | 4/1991 | Hanke et al. | 331/1 A |
| 5,220,295 | | 6/1993 | Glover et al. | |
| 5,260,979 | * | 11/1993 | Parker et al. | 375/108 |
| 5,394,444 | * | 2/1995 | Silvey et al. | 375/374 |
| 5,406,592 | * | 4/1995 | Baumert | 375/376 |
| 5,483,558 | * | 1/1996 | Leon et al. | 375/376 |
| 5,680,076 | * | 10/1997 | Kelkar et al. | 331/25 |
| 5,764,712 | * | 6/1998 | Branstad et al. | 375/376 |
| 5,870,002 | * | 2/1999 | Ghaderi et al. | 331/17 |
| 5,905,410 | * | 5/1999 | Holmes et al. | 331/1 A |
| 5,917,870 | * | 6/1999 | Wolf | 375/356 |

FOREIGN PATENT DOCUMENTS

| 0 637 138 A1 | 2/1995 | (EP) . |
| 0 647 017 A1 | 4/1995 | (EP) . |
| 0 783 204 A2 | 7/1997 | (EP) . |

OTHER PUBLICATIONS

IBM Technical Disclosure Bulletin, vol. 23, No. 1, Jun. 1980, pp. 81–82 (Carnes et al.), "Cycle–Synchronized Phase–Locked Loop".

* cited by examiner

Primary Examiner—Stephen Chin
Assistant Examiner—Dac V. Ha
(74) Attorney, Agent, or Firm—Herbert L. Lerner; Laurence A. Greenberg; Werner H. Stemer

(57) ABSTRACT

The lock detector circuit for a phase-locked loop has two counters and a comparator, to which the counter readings of the two counters are fed. The lock detector circuit is symmetric and has two comparators in which the counter readings of the counters are checked separately in each case. If the difference between the counter readings exceeds a predetermined threshold value in one of the comparators, then the phase-locked loop is immediately set to the non-locked state and the counter readings are reset to zero. Frequency differences are detected immediately in the novel lock detector circuit, without a time delay and independently of the relative position of the reference edges of the signals to be compared. The phase-locked loop is thus quickly and reliably set to a locked or non-locked state. Furthermore, the functioning of the lock detector circuit is preserved when one of the two clock signals fails to appear, for example in the event of a crystal fault.

13 Claims, 3 Drawing Sheets

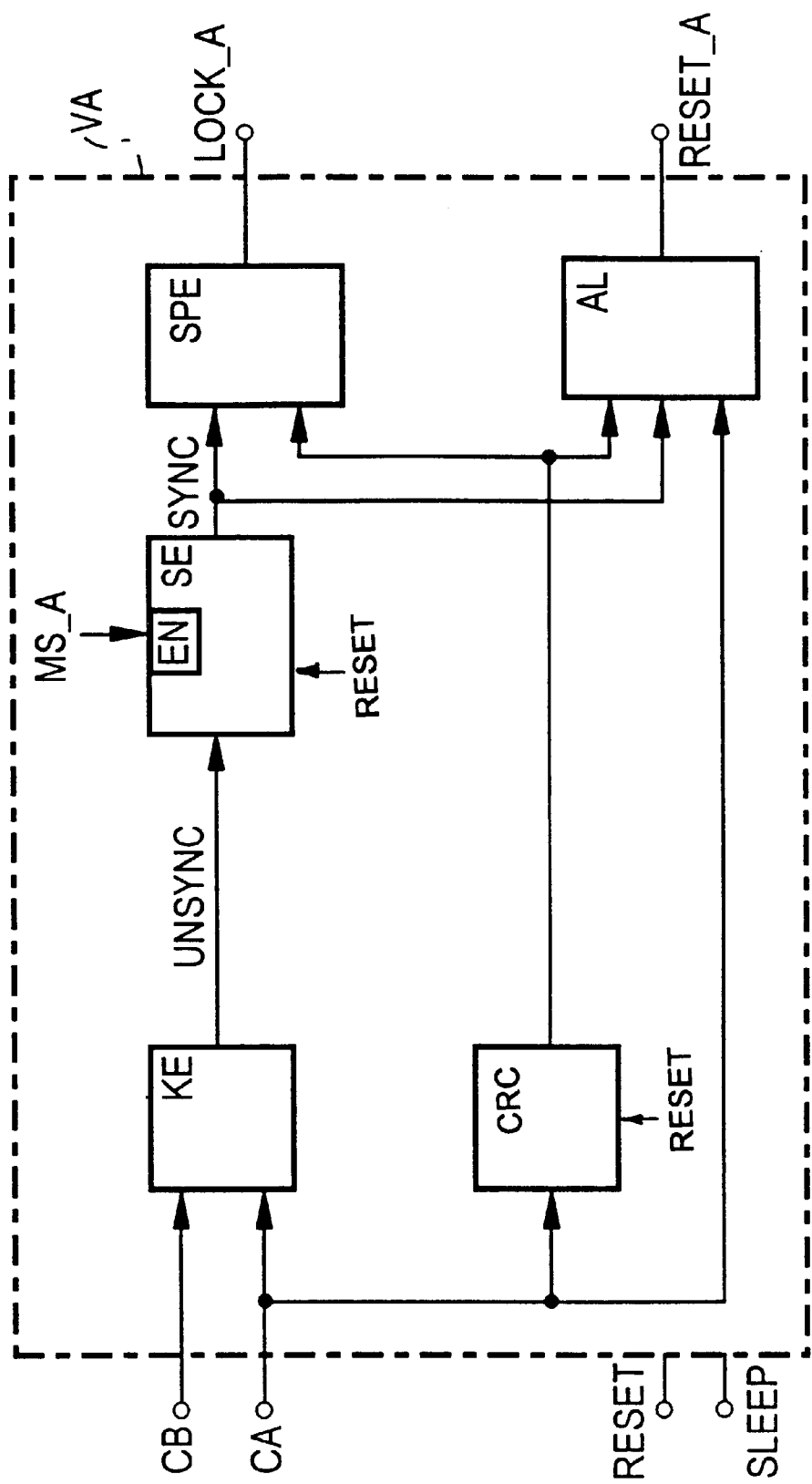

LOCK DETECTOR CIRCUIT FOR A PHASE-LOCKED LOOP

BACKGROUND OF THE INVENTION

1. Field of the Invention

The invention relates to a lock detector circuit for a phase-locked loop comprising at least two counters and a comparator, which receives the counter readings of the two counters. The comparator has a counter reading checking device in which the counter readings are monitored and the phase-locked loop is controlled into the locked state when one of the two counter readings reaches a predetermined final value.

Phase-locked loops (PLL) are used to correct frequency differences between an input signal and a comparison signal. In other words, the phase-locked loop adjusts the frequency of a comparison signal to the frequency of the input signal. The frequency of the comparison signal is either the output frequency of the phase-locked loop directly or it is set in a defined ratio to the output frequency via a divider. The error signal required for the control operation is obtained from the phase difference between the input signal and the comparison signal with the aid of a phase detector.

As long as the frequencies of the input signal and of the comparison signal are far apart, the difference frequency falls outside the passband of the low-pass filter and an error voltage is not produced at the input of the oscillator (VCO) of the phase-locked loop. The oscillator then oscillates at the free-running frequency. The phase-locked loop is not locked in this case.

However, if the frequencies of the input signal and of the output signal come closer to one another, then the situation arises wherein the difference frequency falls within the passband of the low-pass filter. The phase-locked loop is locked in this case. A circuit configuration which detects whether the phase-locked loop is in the locked state is referred to as a lock detector circuit (also: lock detect circuit, lock detection circuit). Such a lock detector circuit generates a binary control signal which, for example, is 0 whenever the phase-locked loop is not locked and which switches to 1 when the phase-locked loop locks.

A generic lock detector circuit for a phase-locked loop is illustrated in FIG. 1. There, a respective input clock signal TA, TB is coupled into a counter ZA, ZB. The first input signal TA may be, for example, the divided-down output signal of the phase-locked loop. The second input signal TB may be the reference signal which is generated by a crystal oscillator, for example.

The counter read signals CA, CB can be picked off at the output of the counters ZA, ZB. The counter readings CA, CB of the two counters ZA, ZB are fed to a comparator V. A lock signal LOCK is available at the output of the comparator V. The counters ZA, ZB can be reset to zero via a reset input RE.

The lock detector circuit LD of FIG. 1 operates as follows:

Assume that the two counters ZA, ZB are negatively edge-triggered. It should be understood, however, that, depending on the specific requirements, they may also be positively edge-triggered. The counters ZA, ZB determine the counter readings CA, CB using the clock frequency of the input signals TA, TB at the input terminals.

If one of the two counters, for example the counter ZA, has reached a predetermined final value, for example 100, then the second counter ZB must likewise reach the predetermined value 100 before the rising edge of the clock signal TA, which is coupled into the first counter ZA, appears. For this case, the comparator V generates at its output a binary control signal LOCK=1, which controls the phase-locked loop into the locked state. The counter readings of the counters ZA, ZB are reset simultaneously via a rest signal RESET.

In the non-locked state, the counter readings CA, CB differ, after one of the two counters ZA, ZB has reached the predetermined value, by more than one clock period, for example. In that case, the comparator outputs a binary control signal LOCK=0, as a result of which the phase-locked loop is set to the non-locked state.

The lock detector circuit of FIG. 1 is conventionally used as a safeguarding circuit for detecting gross frequency differences caused, for example, by a system reset.

Power saving modes are increasingly demanded in integrated circuits, in particular large-scale integrated microprocessors and micro-controllers. Such a power saving mode is the power down mode, for example. In the power down mode, the functional units of the integrated circuit or microprocessor are switched off or greatly slowed down and, consequently, the integrated circuit or the microprocessor is put into an idle state, as it were. In the power down mode, the phase-locked loop, in particular, is switched off. However, it is necessary, at the end of the power down mode, for the lock detector circuit reliably to detect whether the phase-locked loop is locked or not locked.

Such a circuit configuration proves to be problematic, however. Due to the integral summation of the clock signals coupled into the counters ZA, ZB, frequency deviations may remain undiscovered if they are compensated for on average within the counting period given by the predetermined final value of the counters. This is the case particularly when the predetermined final value is chosen to be very large.

If, for example at the start of the predetermined counting period, a change occurs in the frequency of one of the two clock signals that are input, then the phase-locked loop has enough time to react to the irregularity, and possibly compensate for it, before one of the two counters has reached the predetermined final value. However, if the frequency disturbance occurs at the end of the predetermined clock period, the phase-locked loop no longer has time to react to it and compensate for the frequency difference.

This may result in an undesirable state that is referred to as the metastable state: if the control signal of the lock detector circuit is LOCK=0, then the phase-locked loop is actually in the non-locked state. If, however, the control signal is LOCK=1, then the phase-locked loop may be either in the locked or non-locked state.

The counters of the lock detector circuit according to FIG. 1 sum the respective clock signals using the negative edges of the clock signals that are coupled in. The two clock signals that are coupled into the phase-locked loop are set in such a way that in each case one of the clock-signal edges, for example the negative clock-signal edge, correspond to one another. However, the positive clock-signal edge of the PLL clock signal that is coupled in does not usually correspond to the positive clock-signal edge of the reference clock signal, since the duty ratio of the PLL clock signal that is coupled in depends on the clock generator of the user of the external circuitry and the duty ratio of the reference clock signal depends on the PLL factor that is set. Since the sensitivity of the lock detector circuit depends on the position of the positive and negative clock-signal edges relative to one another, it may likewise happen, undesirably, that the phaselocked loop is controlled into the non-locked state even though it is actually locked.

SUMMARY OF THE INVENTION

It is accordingly an object of the invention to provide a lock detector circuit for a phase-locked loop, which overcomes the above-mentioned disadvantages of the heretofore-known devices and methods of this general type and which immediately detects frequency differences without a time delay and independently of the relative position of the reference edges of the signals to be compared, and which controls the phase-locked loop without delay into a locked or non-locked state. Furthermore, it is another object to provide a lock detector circuit which will remain functional in the event of failure of at least one of the clock signals that are coupled in, for example in the event of a crystal defect.

With the foregoing and other objects in view there is provided, in accordance with the invention, a lock detector circuit for a phase-locked loop, comprising:

a first counter outputting first counter readings and a second counter outputting second counter readings;

a comparator connected to the first and second counters and receiving the counter readings of the first and second counters;

the comparator having a comparator device continuously determining a difference between the first and second counter readings and outputting a signal setting a phase-locked loop to a non-locked state when the difference between the first and second counter readings exceeds a predetermined threshold value; and the first and second counters each having a reset input receiving a reset signal resetting the respective counter reading to zero when the predetermined threshold value is exceeded or when a predetermined final counter value is reached.

In other words, the objects of the invention are satisfied with the following features:

the comparator contains a comparator device in which the difference between the counter readings is continuously determined and the phase-locked loop is controlled into the non-locked state when the difference between the counter readings exceeds a predetermined threshold value; and when the predetermined threshold value is exceeded, or when the predetermined final value is reached, the counter readings are reset to zero.

The counter readings of the two counters are continually compared with one another by the lock detector circuit according to the invention. If the difference between the counter readings is greater than a predetermined threshold value, then the phase-locked loop is controlled without delay into the non-locked state. If the difference falls below the threshold value, then the comparison of the counter readings is repeated until a predetermined final value is reached. When this predetermined final value is reached, both counters are reset to zero by a reset device.

Consequently, the lock detector circuit according to the invention enables frequency differences to be detected immediately and the phase-locked loop to be set without a time delay into a locked or non-locked state. In the case of circuit configurations having a power down mode, in particular, it is very important that the locked state of the phase-locked loop is reliably detected immediately during restarting or running up of the phase-locked loop.

A counter reading checking device is provided in the comparator. There it is determined whether the predetermined final value has been reached. The counter reading checking device can advantageously be realized by a simple master-slave flip-flop.

The difference between the counter readings in the comparators is determined by a comparator device. In a very simple embodiment, the comparator device may be a simple comparator which compares the counter readings with one another bit by bit.

In accordance with an added feature of the invention, there is provided a second comparator in addition to the first above-mentioned comparator. The second comparator is symmetrically constructed, relative to clock signals input into the first and second counters, to the first comparator, each of the first and second comparators receiving the first and second counter readings of the first and second counters, and each of the first and second comparators receiving and being controlled separately by a respectively different control signal. In other words, the difference between the counter readings is determined separately in the two comparators. Each comparator is driven separately by the respective counter. If one of the two comparators fails, for example as a result of a crystal interruption, then the phase-locked loop is set without delay into the non-locked state by the other comparator.

The clock signals are advantageously counted in the counters using the same clock-signal edge, typically the negative reference clock-signal edge. It goes without saying that positively edge-triggered counters are also conceivable.

In accordance with an additional feature of the invention, the comparators include a synchronization device for synchronizing the first and second counter reading signals, i.e., the mutually asynchronous counter reading signals. This avoids metastable states. The synchronization devices are realized by a simple master-slave flip-flop in a preferred configuration. Skillful selection of the synchronization instants, moreover, makes it possible to prevent an unintentional transition from LOCK=1 to LOCK=0 from taking place in the LOCK=1 case due to capture of a metastable state. The synchronization devices can be realized in a different way, however.

In accordance with another feature of the invention, the comparator checks the difference between the first and second counter readings after four clock cycles. If a more exact resolution is desired, then it is also possible to monitor the difference for counter readings after one or two clock cycles. If, on the other hand, it is not necessary that the counter readings be checked very frequently, for example when the predetermined counting period is very large, then the checking of the difference between the counter readings can also be performed after more than four clock cycles.

In accordance with a further feature of the invention, the predetermined threshold value is greater than 2. If the predetermined counting period is chosen to be very large, then this threshold value can be chosen to be greater than 2, however. If, on the other hand, a very fine resolution is desired in order to detect extremely small frequency inaccuracies, then the threshold value may assume a lower value.

In accordance with again another feature of the invention, the predetermined threshold value is smaller than the predetermined final value at least by a factor of 100.

In accordance with again a further feature of the invention, the predetermined final value and/or the predetermined threshold value are adjustable values, i.e., they can be set externally under the control of a program by the user, for example. This makes it possible to set the lock detector circuit to the desired requirements. Both the predetermined final value and the predetermined threshold value can, moreover, be made dependent on the signal characteristic of the lock signal. For example, the predetermined threshold value for LOCK=0 could be 2 and in the locked state 4. This hysteresis would additionally prevent the lock detector circuit from reacting too sensitively to overshooting of the phase-locked loop after a transition from the non-locked state to the locked state and from momentarily falling back to the non-locked state. The consequence of this would be that the systems surrounding the phase-locked loop would interpret this, under certain circumstances, as a failure of the phaselocked loop and they could possibly shut down the phase-locked loop.

In accordance with a concomitant feature of the invention, a reset manager is connected to the reset inputs for selectively resetting the counter readings in the first and second counters. In an advantageous configuration, the reset manager has a very short delay time. The reset manager can be realized in a particularly simple manner by a logic OR gate.

Other features which are considered as characteristic for the invention are set forth in the appended claims.

Although the invention is illustrated and described herein as embodied in a lock detector circuit for a phase-locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a block diagram of a comparator of the lock detector circuit according to the invention.

DESCRIPTION OF THE PREFERRED EMBODIMENTS

Figure 1:
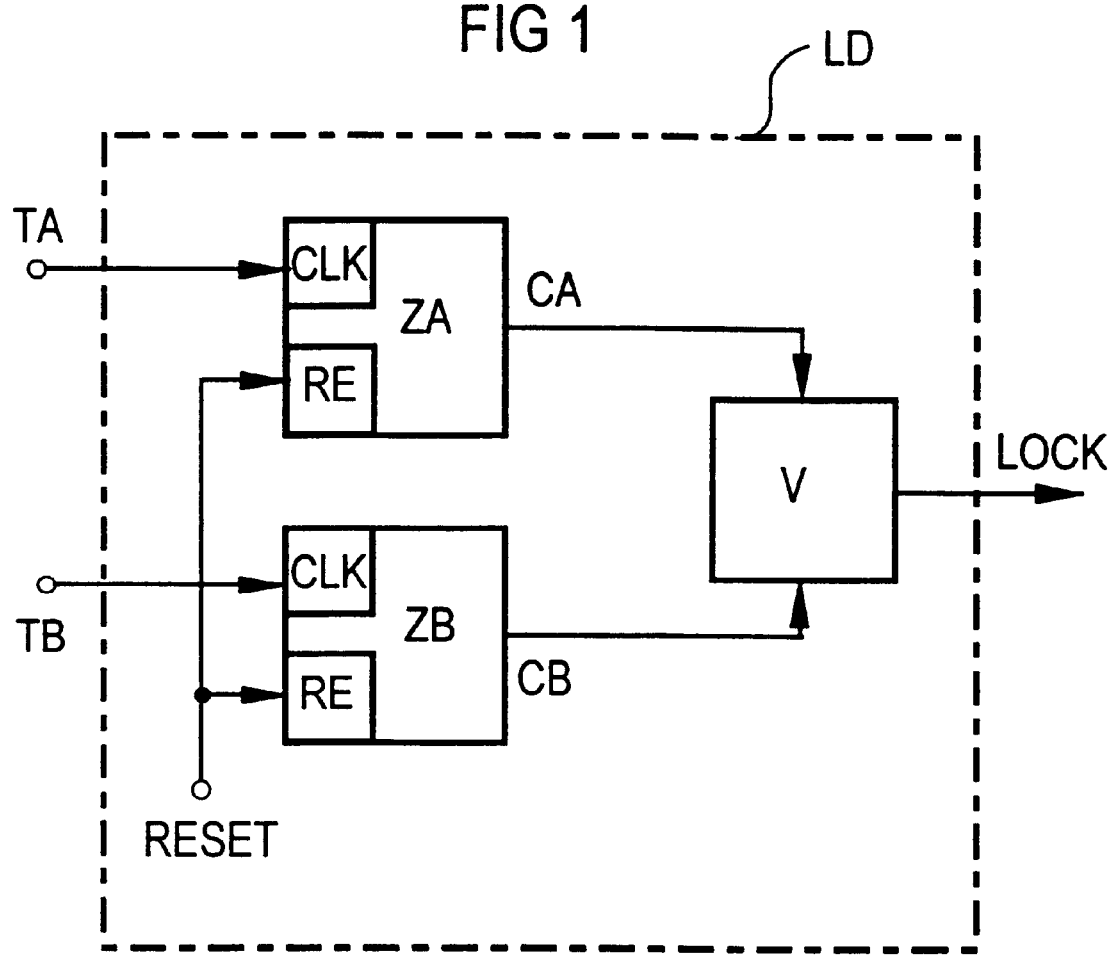
FIG. 1 is a block diagram of a prior art lock detector circuit for phase-locked loop.
Figure 2:
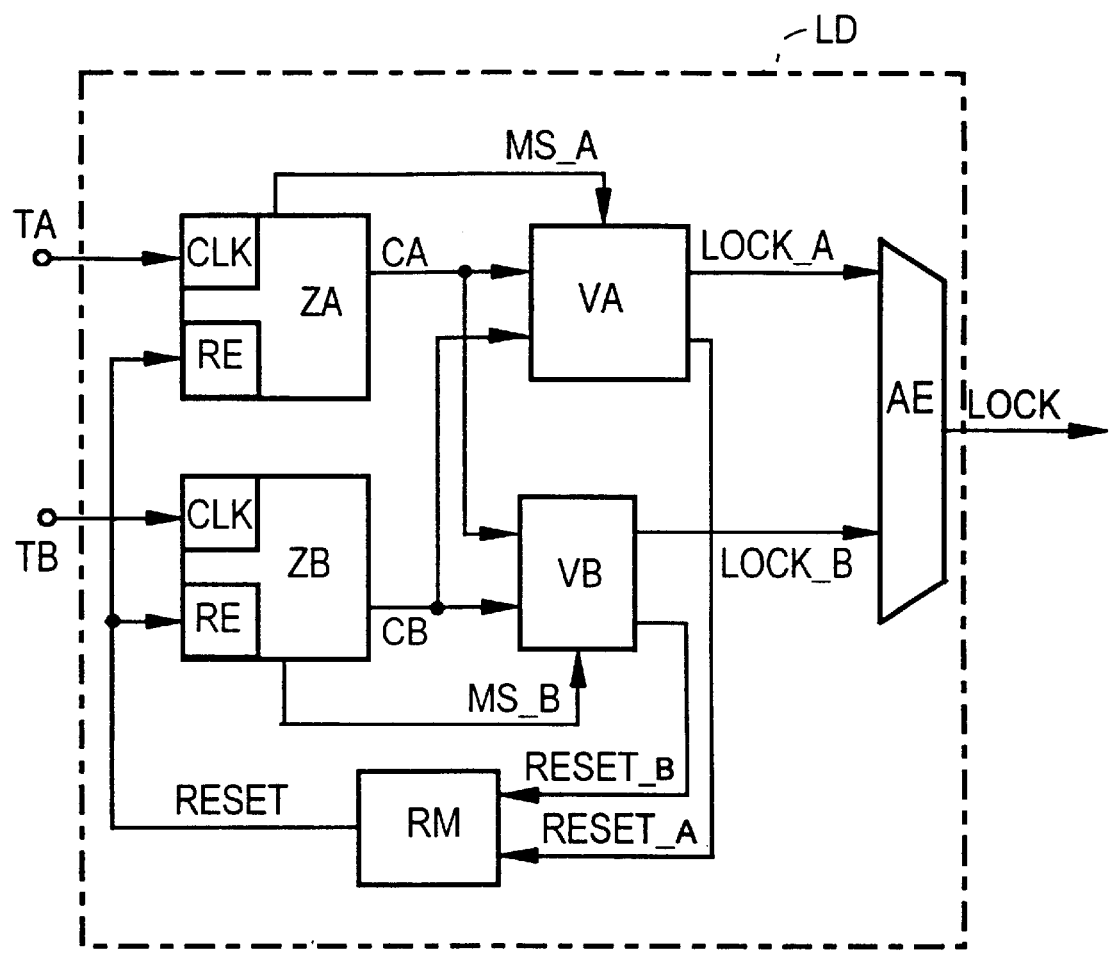
FIG. 2 is a block diagram of the lock detector circuit according to the invention.

Referring now to the figures of the drawing in detail and first, particularly, to FIG. 2 thereof, there is seen a novel lock detector circuit LD for a phase-locked loop.

The lock detector circuit LD contains a first and second counter ZA, ZB. A first input clock signal TA is coupled into the first counter ZA. A second input clock signal TB is coupled into the second counter ZB. The first input clock signal TA may be, for example, the divided-down output clock signal of the phase-locked loop. The second input clock signal TB is the reference clock signal, which is generated by a crystal oscillator, for example. The two input clock signals TA, TB are respectively coupled in at the clock inputs CLK of the counters ZA, ZB.

The two counters ZA, ZB count the clock cycles of the divided-down PLL output clock signal and of the reference clock signal, respectively. Since, in the present example, the phase-locked loop is designed in such a way that the negative reference edges of the two clock signals TA, TB that are coupled in respectively correspond to one another, the counters ZA, ZB are negatively edge-triggered.

A respective counter reading signal CA, CB is available at the output of the counters ZA, ZB. Two comparators VA, VB are connected downstream of the two counters ZA, ZB. The counter readings CA, CB of the two counters of ZA, ZB are each fed to both comparators VA, VB. In addition, the comparators VA, VB are driven by a respective master-slave control signal MS_A, MS_B of the respective counter ZA, ZB. These master-slave control signals MS_A, MS_B are generated in the counters ZA, ZB from the clock signals TA, TB.

A respective lock signal LOCK_A, LOCK—B is available at a first output of the comparators VA, VB. These lock signals LOCK_A, LOCK_B are fed to a selection device AE. The selection device AE generates a further lock signal LOCK, which controls the phase-locked loop into the locked or non-locked state. The selection device AE may be realized in a simple manner by a logic AND gate.

Reset signals RESET—A, RESET—B are available at the second outputs of the comparators VA, VB. The reset signals RESET_A, RESET_B are fed to a reset manager RM. On the output side, the reset manager RM generates a reset signal RESET, which is coupled into the reset input RE of the counters ZA, ZB. The counter readings CA, CB in the counters ZA, ZB are reset to 0 by the reset signal RESET. The reset manager RM usually has a very short delay time. In a most typical and simple design the reset manager may be realized as a simple OR gate.

Referring now to FIG. 3, there is shown an exemplary embodiment of the comparator VA of the inventive lock detector circuit LD illustrated in FIG. 2. Identical elements are provided with identical reference symbols corresponding to FIG. 2.

The counter readings CA, CB of the first and second clock counters ZA, ZB are coupled into a comparator device KE. The comparator device KE may be realized for example by a simple comparator which compares the counter readings CA, CB with one another bit by bit. The output signal UNSYNC of the comparator device KE is output to a synchronization device SE.

The synchronization device SE is controlled by the control signal MS_A, which is generated by the first counter ZA. The output signal SYNC is available on the output side of the synchronization device SE.

In addition, the counter reading CA of the first clock counter ZA is fed to a counter reading checking device CRC. The counter reading checking device CRC checks whether the counter reading CA of the first clock counter ZA has already reached the predetermined final value. The output signals of the counter reading checking device CRC and of the synchronization device SE are fed to a storage device SPE. The storage device SPE stores the last lock conditions. The storage device SPE may typically be realized by an RS flip-flop. The lock signal LOCK_A is available at the output of the storage device SPE and, as shown in FIG. 2, is output to the selection device AE.

The counter reading signal CA, the output signal SYNC of the synchronization device SE and the output signal of the counter reading checking device CRC are fed to a second selection logic device AL. The reset signal RESET_A is available at the output of the selection logic device AL. The selection logic device AL may be formed for example by an AND and a NOR gate which are interconnected in one another.

The comparator VA according to FIG. 3 additionally has a reset input RESET and a sleep input SLEEP. The MS flip-flops of the synchronization device SE and of the counter reading monitoring device CRC are reset via the reset input RESET. It is possible to switch the comparator VA to the power down mode or from the power down mode to the locked state via the sleep input SLEEP.

The novel lock detector circuit LD operates as follows: if, during a counting operation, the difference between the counter readings CA and CB is greater than a predetermined threshold value, then the lock signals LOCK_A, LOCK_B at the two outputs of the comparators VA, VB are equal to 0. As a result, the lock signal LOCK at the output of the selection device AE also becomes LOCK =0. The phase-locked loop is set to the non-locked state.

At the same time, the reset signals RESET_A, RESET_B are generated by means of the selection logic devices AL. The reset signals reset the counter readings CA, CB of the counters ZA, ZB to 0 via the reset manager RM. However, if, during a counting operation, the difference between the counter readings CA, CB is less than the predetermined threshold value, then the counting operation and the checking of the difference between the counter readings CA, CB are continued until one of the counters ZA, ZB reaches a predetermined final value. The reaching of the predetermined final value is monitored by the counter reading checking device CRC. In this case, the comparators VA, VB generate a lock signal LOCK_A, LOCK_B equal to 1. The lock signal LOCK at the output of the selection device AE becomes LOCK=1. At the same time, the counter readings CA, CB are reset to 0 via the selection logic device AL at the reset manager RM.

In the present example, the predetermined threshold value is assumed to be two clock cycles. If a more exact resolution is required, the predetermined threshold value may also be assumed to be one clock cycle. However, it is also conceivable to choose a very large predetermined counting period defined by the predetermined final value. In this case, or if the inaccuracies are small, a predetermined threshold value which is greater than two clock cycles is also conceivable.

The operation of the individual function blocks of the lock detector circuit LD and the comparators VA, VB according to FIGS. 2 and 3 are is as follows:

In the exemplary embodiment, the counters ZA, ZB are bit timing counters with an asynchronous reset. The counters contain a master-slave register and an up-counter. A signal containing the current counter reading CA, CB is available at the output of the counters ZA, ZB. The first counter ZA receives that output clock signal of the phase-locked loop, divided down by a given ratio. The reference clock signal, which is provided by a crystal oscillator, for example, is coupled into the second counter ZB. The two counters ZA, ZB are typically identical in terms of their design.

In addition, a clock generator may be provided in the counters ZA, ZB. The clock generator generates non-overlapping clock signals having a positive and a negative reference edge from the clock signal TA, TB that is coupled in. These clock signals are the master-slave control signals MS_A, MS_B in the present example. However, the clock generator does not necessarily have to be provided in the counters ZA, ZB, but rather may also be realized externally. In a manner corresponding to the two counters ZA, ZB, the clock generators are also largely identical in terms of their design.

The reset manager RM links the two reset signals RESET_A, RESET_B that are coupled in. The reset manager RM essentially comprises a logic OR gate which generates a common reset signal RESET at its output. The reset signal RESET is coupled into the reset input RE of the counters ZA, ZB. The two counters ZA, ZB are reset to 0 by means of the reset signal RESET. After the counters ZA, ZB have been reset to 0, the reset manager RM is likewise reset and the reset signal RESET is disabled.

Due to the symmetrical structure of the lock detector circuit LD it is possible, when one of the clock signals that are coupled in fails to appear, for example in the event of a crystal fault, for the functioning of the lock detector circuit LD to be preserved and for the phase-locked loop to be controlled immediately into the non-locked state. The phaselocked loop can then continue to be operated by an emergency clock signal.

The synchronization device SE synchronizes the asynchronous comparator output signal UNSYNC. In this case, a control signal is coupled in at a control input of the synchronization device SE, which control signal switches on the synchronization device SE only at instants when the two input clock signals TA, TB that are coupled in have mutually synchronous profiles. Metastable states can be avoided in this way. It is thus ensured that an output signal SYNC which is synchronous with regard to the two input clock signals TA, TB that are coupled in can be picked off at the output of the synchronization device SE.

A defined state can be generated via the sleep terminal SLEEP as a result of switching off the lock detector circuit LD. This is important particularly when the circuit is being tested.

In the power down mode, the phase-locked loop is switched off and thus not locked. When the phase-locked loop is switched on, the phase-locked loop starts to adjust the reference clock signal to the desired frequency. The lock detector circuit according to the invention ensures that the phase-locked loop is set to the "locked" status only when the regulating operation is concluded within the framework of the required accuracy.

The choice of the predetermined threshold value of the lock detector circuit furthermore makes it possible to choose the lock conditions favorably and to avoid possible overshooting of the phase-locked loop during settling, for example due to a large predetermined threshold value. A lower predetermined threshold value could then be set in normal operation of the phase-locked loop, in which overshooting of the frequencies is not to be expected.

It is particularly advantageous, therefore, to set the predetermined threshold value externally. This permits the user to choose this predetermined threshold value freely depending on the requirements or resolution. Furthermore, it is also advantageous to enable external setting the clock period (determined by the predetermined final value).

The lock detector circuit LD according to the invention can be used both for an analog phase-locked loop and for a digital phase-locked loop. In an analog phase-locked loop, it is necessary in this case to provide a matching mechanism at the input of the lock detector circuit LD which converts the analog signals into conventional digital signals.

I claim:

1. A lock detector circuit for a phase-locked loop, comprising:

a first counter outputting first counter readings and a second counter outputting second counter readings;

a comparator connected to said first and second counters and receiving the counter readings of said first and second counters;

said comparator having a comparator device continuously determining a difference between the first and second counter readings and outputting a signal setting a phase-locked loop to a non-locked state when the difference between the first and second counter readings exceeds a predetermined threshold value; and said first and second counters each having a reset input receiving a reset signal resetting said respective counter reading to zero when the predetermined threshold value is exceeded or when a predetermined final counter value is reached.

2. The lock detector circuit according to claim 1, wherein said comparator is a first comparator and including a second comparator, said second comparator, relative to clock signals input into said first and second counters, being constructed symmetrically to said first comparator, each of said first and second comparators receiving the first and second counter readings of said first and second counters, and each of said first and second comparators receiving and being controlled separately by a respectively different control signal.

3. The lock detector circuit according to claim 2, wherein each of said first and second comparators includes a respective synchronization device for synchronizing the first and second counter reading signals.

4. The lock detector circuit according to claim 1, wherein said first and second counters are adapted to determine the respective counter readings from an identical reference edge of a clock signal received thereby.

5. The lock detector circuit according to claim 4, wherein said first and second counters are edge-triggered counters.

6. The lock detector circuit according to claim 1, wherein said comparator includes a synchronization device for synchronizing the first and second counter reading signals.

7. The lock detector circuit according to claim 1, wherein said comparator checks the difference between the first and second counter readings after four clock cycles.

8. The lock detector circuit according to claim 1, wherein the predetermined threshold value is greater than 2.

9. The lock detector circuit according to claim 1, wherein the predetermined threshold value is smaller than the predetermined final value at least by a factor of 100.

10. The lock detector circuit according to claim 1, wherein the predetermined final value and the predetermined threshold value are adjustable values.

11. The lock detector circuit according to claim 1, wherein the predetermined final value is adjustable.

12. The lock detector circuit according to claim 1, wherein the predetermined threshold value is adjustable.

13. The lock detector circuit according to claim 1, which further comprises a reset manager connected to said reset inputs for selectively resetting the counter readings in said first and second counters.

* * * * *